United States Patent
Park et al.

(10) Patent No.: US 9,915,693 B2
(45) Date of Patent: Mar. 13, 2018

(54) SYSTEM AND METHOD FOR DIAGNOSING INSULATION-BREAKDOWN OF VEHICLE COMPONENT

(71) Applicants: Hyundai Motor Company, Seoul (KR); Kia Motors Corporation, Seoul (KR)

(72) Inventors: Hyun Soo Park, Gyeonggi-do (KR); Sang Hwan Kim, Gyeonggi-do (KR)

(73) Assignees: Hyundai Motor Company, Seoul (KR); Kia Motors Corporation, Seoul (KR)

(*) Notice: Subject to any disclaimer, the term of this patent is extended or adjusted under 35 U.S.C. 154(b) by 287 days.

(21) Appl. No.: 14/805,586

(22) Filed: Jul. 22, 2015

(65) Prior Publication Data

US 2016/0146876 A1   May 26, 2016

(30) Foreign Application Priority Data

Nov. 26, 2014 (KR) ........................ 10-2014-0166611

(51) Int. Cl.
*G01R 31/02* (2006.01)
*G01R 31/00* (2006.01)

(52) U.S. Cl.
CPC .......... *G01R 31/025* (2013.01); *G01R 31/007* (2013.01)

(58) Field of Classification Search
CPC combination set(s) only.
See application file for complete search history.

(56) References Cited

U.S. PATENT DOCUMENTS

| 2013/0002262 A1* | 1/2013 | Tago | G01R 31/006 |
| | | | 324/503 |
| 2013/0335095 A1 | 12/2013 | Kiuchi | |
| 2014/0039740 A1 | 2/2014 | Kwon et al. | |
| 2014/0197683 A1 | 7/2014 | Migita et al. | |
| 2015/0224881 A1* | 8/2015 | Deyda | B60R 21/01 |
| | | | 701/29.2 |
| 2016/0163127 A1* | 6/2016 | Kim | B60R 16/033 |
| | | | 701/36 |

FOREIGN PATENT DOCUMENTS

JP  2014-138443 A  7/2014
KR  10-2008-0030753 A  4/2008
(Continued)

*Primary Examiner* — Thomas G Black
*Assistant Examiner* — Ana D Thomas
(74) *Attorney, Agent, or Firm* — Mintz Levin Cohn Ferris Glovsky and Popeo, P.C.; Peter F. Corless (57) ABSTRACT

A system and method for diagnosing insulation-breakdown of a vehicle component including a system in a vehicle including high voltage components are provided. The system includes a battery pack that is configured to supply a high voltage to the vehicle and a high voltage relay that is connected to an output stage of the battery pack. Additionally, a high voltage component controller is connected to an output stage of the high voltage relay to turn the high voltage component on and off. A battery management system interlocks with the battery pack, the high voltage relay, and the high voltage component controller to diagnose whether the battery pack, an input stage of the high voltage component controller, and the high voltage component are insulated-breakdown.

15 Claims, 3 Drawing Sheets

(56) References Cited

FOREIGN PATENT DOCUMENTS

| KR | 10-2013-0042136 A | 4/2013 | |
|---|---|---|---|
| KR | 10-2013-0112496 A | 10/2013 | |
| KR | 10-2014-0010417 A | 1/2014 | |
| KR | 10-2014-0017783 A | 2/2014 | |
| KR | 10-1380575 B1 | 4/2014 | |
| WO | WO 2013118959 A1 * | 8/2013 | ..... H03K 19/017509 |
| WO | WO-2013118959 A1 * | 8/2013 | ..... H03K 19/017509 |

* cited by examiner

SYSTEM AND METHOD FOR DIAGNOSING INSULATION-BREAKDOWN OF VEHICLE COMPONENT

CROSS-REFERENCE TO RELATED APPLICATION

This application is based on and claims the benefit of priority to Korean Patent Application No. 10-2014-0166611, filed on Nov. 26, 2014 in the Korean Intellectual Property Office, the disclosure of which is incorporated herein in its entirety by reference.

TECHNICAL FIELD

The present disclosure relates to a system and a method for diagnosing insulation-breakdown of a vehicle component, and more particularly, to a technology of more accurately determining a corresponding portion during insulation-breakdown of a vehicle.

BACKGROUND

A hybrid electric vehicle using a high voltage battery includes a system that automatically cuts off (e.g., disconnects) power of a main high voltage battery during an emergency. The emergency indicates excessive electric leakage, insulation breakdown, or the like, due to aging of related components and excessive electric leakage, insulation breakdown, or the like, generated due to a short circuit caused by the destruction of components due to external impact.

When the emergency is generated in a vehicle, an upper component that operates a high voltage component, such as a battery management system (BMS), a hybrid control unit (HCU), or the like, is configured to output a command to cut off a main power to thereby cut off the power. However, since all of the high voltage components are operated while driving during the occurrence of the failure of high voltage insulation-breakdown in a vehicle, it may be difficult to determine which component has failed. In other words, the related art may not accurately determine the defective component and thus may only determine whether the high voltage insulation-breakdown for the overall system of the vehicle is present.

Therefore, when a failure occurs due to the insulation-breakdown, the insulation-breakdown portion may be identified by measuring insulating resistance while sequentially separating and then replacing all of the high voltage components, requiring substantial time and labor force to detect the defective components and an unnecessary incorrect service may also be performed.

SUMMARY

The present disclosure provides a system and a method for diagnosing insulation-breakdown of a vehicle component capable of improving service efficiency and preventing an incorrect service by allowing a high voltage battery controller to detect defective components due to insulation-breakdown under a cooperative control with all of the high voltage component controllers of a vehicle.

According to an exemplary embodiment of the present disclosure, a system for diagnosing insulation-breakdown of a vehicle component including a system within a vehicle having high voltage components may include: a battery pack configured to supply a high voltage to the vehicle; a high voltage relay connected to an output stage of the battery pack; a high voltage component controller connected to an output stage of the high voltage relay to turn the high voltage component on and off; and a battery management system configured to interlock with the battery pack, the high voltage relay, and the high voltage component controller to diagnose whether the battery pack, an input stage of the high voltage component controller, and the high voltage component are insulated-breakdown.

The system may further include: a diagnostic apparatus disposed extraneous to the vehicle and configured to interlock with the battery management system which is the system within the vehicle configured to output an insulation-breakdown diagnostic result on a display. The high voltage component may be at least one of a motor, a hybrid starter generator (HSG), a compressor, and an electric oil pump (EOP).

According to another exemplary embodiment of the present disclosure, a method for diagnosing insulation-breakdown of a vehicle component of a vehicle system including a battery pack, a high voltage relay, a high voltage component controller, and a high voltage component may include: determining whether the battery pack is insulated-breakdown in a state in which the high voltage relay and the high voltage component are in an off state (e.g., a turned off); determining whether a high voltage input stage between the high voltage relay and the high voltage component controller is insulated-breakdown in a state in which the high voltage relay is in an on state (e.g., turned on) when the battery pack is not in an insulation-breakdown state; and in response to determining that the high voltage input stage is not in an insulation-breakdown state, determining whether the high voltage component is insulated-breakdown.

The determination of whether the battery pack is insulated-breakdown may include: measuring insulating resistance when the high voltage relay is in an off state; determining whether the high voltage component is in an off state; determining whether the battery pack is insulated-breakdown using the measured insulating resistance when the high voltage component is in the off state; and performing reporting on the insulation-breakdown of the battery pack when the battery pack is insulated-breakdown.

The method may further include: when the high voltage component is in the on state, stopping an insulation-breakdown diagnosis and outputting an error message. The determination of whether the high voltage input stage is insulated-breakdown may further include: measuring insulating resistance when the high voltage relay is in the on state; determining whether the high voltage component is in the off state; determining whether the high voltage input stage is insulated-breakdown using the measured insulating resistance when the high voltage component is in the off state; and performing the reporting of the insulation-breakdown of the high voltage input stage when the high voltage input stage is insulated-breakdown.

The method may further include: in response to determining that the high voltage component is in the on state (e.g., is not in the off state), stopping an insulation-breakdown diagnosis and outputting an error message. In addition, the determination of whether the high voltage component is insulated-breakdown, the high voltage component may be at least one of a motor, a hybrid starter generator (HSG), a compressor, and an electric oil pump (EOP), and the motor, the hybrid starter generator (HSG), the compressor, and the electric oil pump (EOP) may be sequentially turned on to determine whether the components are insulated-breakdown.

Further, the determination of whether the high voltage component is insulated-breakdown may include: requesting a turn on of the motor from the motor controller; terminating the diagnosis when the motor is not turned on (e.g., is turned off) within a predetermined time and outputting an error message; determining whether at least one of the hybrid starter generator, the compressor, and the electric oil pump is in an on state when the motor is turned on within the predetermined time; and determining whether the motor is insulated-breakdown when all of the hybrid starter generator, the compressor, and the electric oil pump are in an off state and generating and storing a list of the insulation-breakdown components.

The determination of whether the high voltage component is insulated-breakdown may also include: after performing the diagnosis regarding whether the motor is insulated-breakdown, determining whether at least one of the hybrid starter generator, the compressor, and the electric oil pump is insulated-breakdown; and outputting the list of the insulation-breakdown components when the insulation-breakdown diagnosis of the motor, the hybrid starter generator, the compressor, and the electric oil pump is completed.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the invention. As used herein, the singular forms "a", "an" and the are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/of" includes any and all combinations of one or more of the associated listed items.

Hereinafter, exemplary embodiments of the present disclosure will be described in detail with reference to the accompanying drawings so that those skilled in the art may easily practice the present disclosure. The present disclosure discloses a technology of diagnosing insulation-breakdown for each high voltage component by a cooperative control between a battery management system (BMS) of a hybrid electric vehicle or an electric vehicle and each controller.

Figure 2:
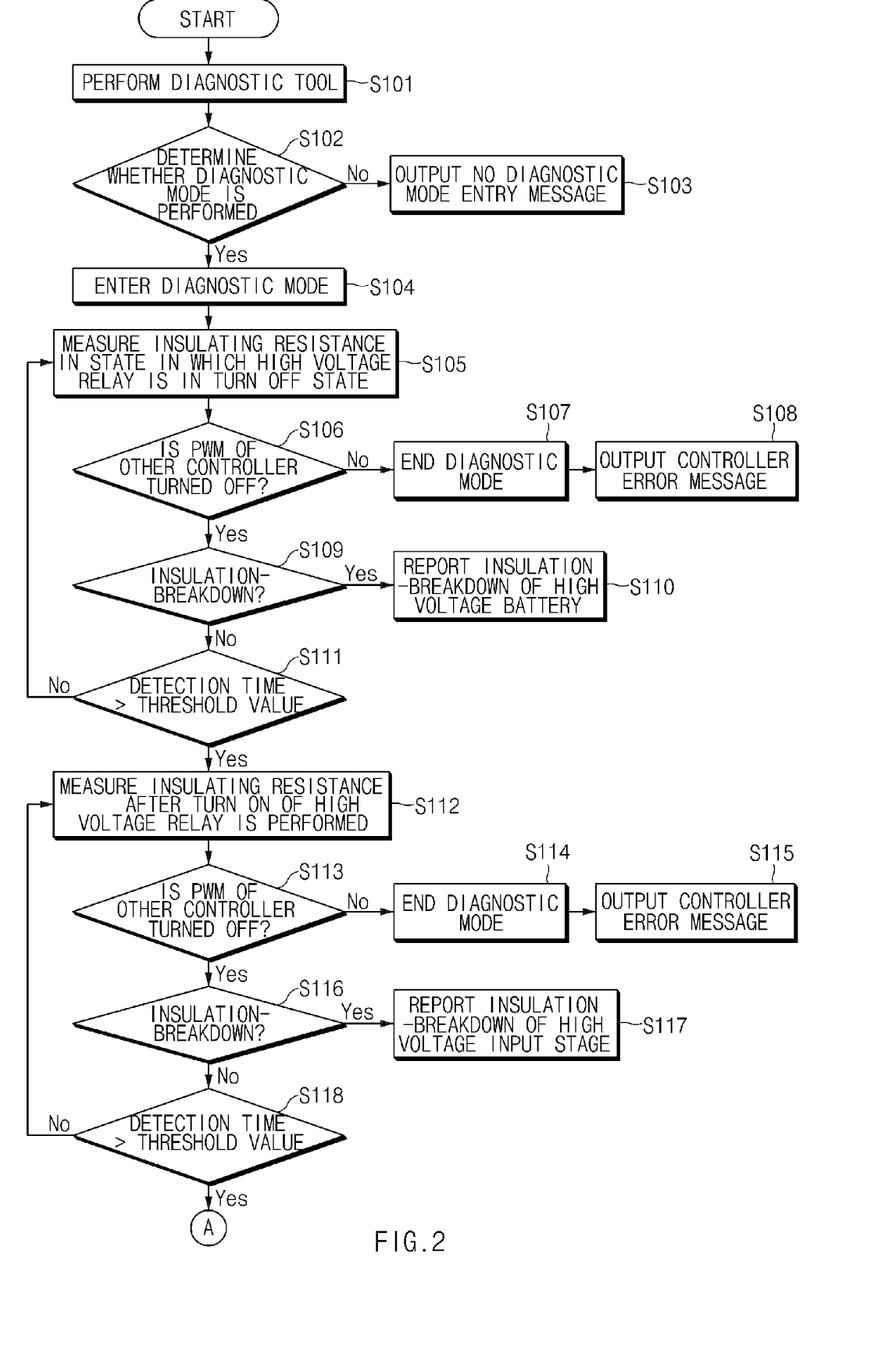
FIG. 2 is a flow chart illustrating a method for diagnosing insulation-breakdown of a battery pack and a high voltage input stage among vehicle components according to an exemplary embodiment of the present disclosure.
Figure 3:
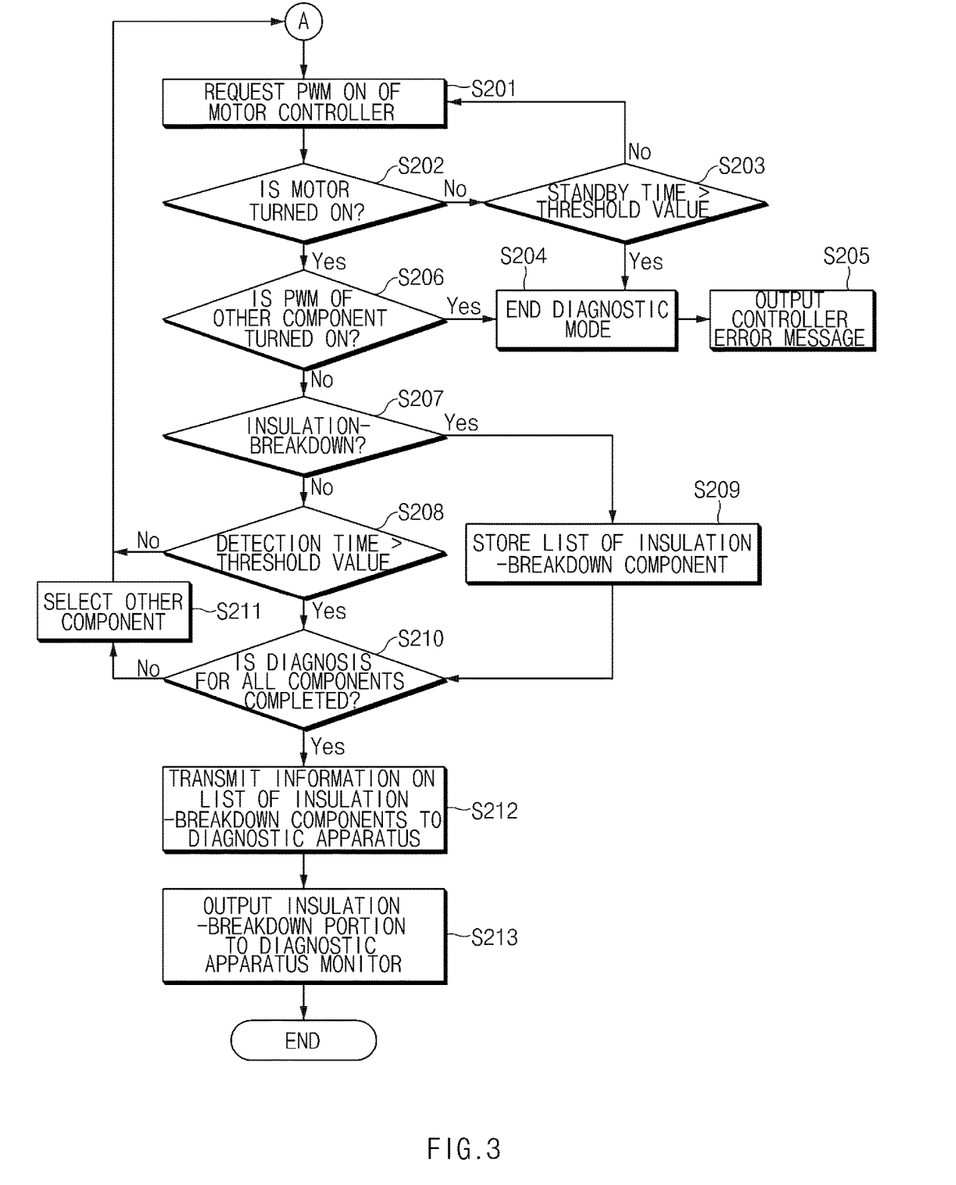
FIG. 3 is a flow chart illustrating a method for diagnosing insulation-breakdown of a motor, a hybrid starter generator, a compressor, and an electric oil pump, respectively, among the vehicle components according to the exemplary embodiment of the present disclosure.

Hereinafter, exemplary embodiments of the present disclosure will be described in detail with reference to FIGS. 1 to 3.

Figure 1:
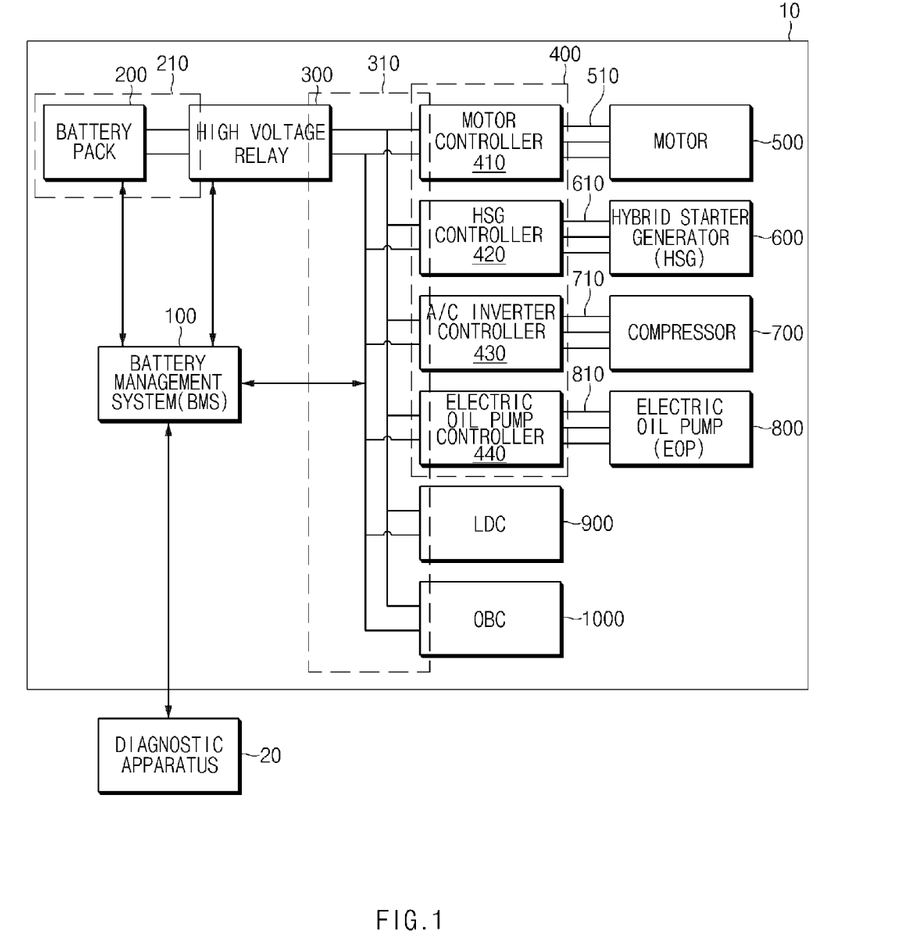
FIG. 1 is a configuration diagram of a system for diagnosing insulation-breakdown of a vehicle component according to an exemplary embodiment of the present disclosure.

FIG. 1 is a configuration diagram of a system for diagnosing insulation-breakdown of a vehicle component according to an exemplary embodiment of the present disclosure. A system for diagnosing insulation-breakdown of a vehicle component according to an exemplary embodiment of the present disclosure may be implemented by interlocking a module within a vehicle 10 with a diagnostic apparatus 20 extraneous to the vehicle.

In other words, the system for diagnosing insulation-breakdown of a vehicle component within the vehicle may include a battery management system 100, a battery pack 200, a high voltage relay 300, a controller 400, a motor 500, a hybrid starter generator (HSG) 600, a compressor 700, an electric oil pump (EOP) 800, a low DC-DC converter (LDC) 900, and an onboard battery charger (OBC) 1000.

The battery pack 200 may be configured to supply power of a hybrid electric vehicle or an electric vehicle. The high voltage relay 300 may be configured to transfer a high voltage of the battery pack 200 to various components within the vehicle. The controller 400 may interlock (e.g., communicate) with the battery management system 100 to turn the components 500 to 800 within the vehicle on and off. The controller 400 may include a motor controller 410, an HSG controller 420, an A/C inverter controller 430, and an electric oil pump controller (OPU) 440. The motor controller 410 may be configured to turn the motor 500 on and off, the HSG controller 420 may be configured to turn the HSG 600 on and off, the A/C inverter controller 430 may be configured to turn the compressor 700 on and off, and the electric oil pump controller (OPU) 440 may be configured to turn the electric oil pump 800 on and off.

The motor 500 and the hybrid starter generator (hereinafter, referred to as HSG 600) may be configured to drive the wheels of a vehicle, the compressor 700 may be configured to drive (e.g., operate) an air conditioner, and the electric oil pump 800 may be configured to pump oil into an oil fan and transfer the pumped oil to apparatuses within the vehicle. The LDC 900 may be a low voltage converter and the OBC 1000 may be configured to charge a battery of the vehicle.

When the battery management system 100 receives a request for performance of a diagnostic tool from the diagnostic apparatus 20 extraneous to the vehicle, the battery management system 100 may be configured to enter a diagnostic mode and measure insulating resistance of a battery pack stage 210, a high voltage input stage 310, and high voltage component stages 510, 610, 710, and 810 to determine whether these components are insulated-breakdown. In particular, a method for measuring insulating resistance uses the existing method and therefore a detailed description thereof will be omitted.

When measuring the insulation-breakdown of the battery pack stage 210, the battery management system 100 may be configured to measure the insulating resistance when the high voltage input stage 310 and the high voltage component stages 510, 610, 710, and 810 are turned off to determine whether the battery pack stage 210 is insulated-breakdown. When the battery pack stage 210 is not insulated-breakdown, the battery management system 100 may be configured to determine whether the high voltage input stage 310 is insulated-breakdown when the high voltage input stage 310 and the high voltage component stages 510, 610, 710, and 810 are turned off. When the insulation-breakdown of the battery pack stage 210 and the high voltage input stage 310 does not occur, the battery management system 100 may be configured to sequentially turn on the motor 500, the hybrid starter generator 600, the compressor 700, and the electric oil pump 800 which are high voltage components configured to measure the insulating resistance, thereby determining whether each component is insulated-breakdown.

Hereinafter, a method for diagnosing insulation-breakdown of the battery pack and the high voltage input stage among vehicle components according to an exemplary embodiment of the present disclosure will be described with reference to FIG. 2.

First, when receiving a request for the performance of the diagnostic tool from a user (S101), the diagnostic apparatus 20 may interlock (e.g., communicate) with the battery management system 100 to determine whether the diagnostic mode is performed (S102). In particular, the diagnostic apparatus 20 may be configured to determine whether an ignition signal is in a turn on state or an HEV/EV not ready to determine whether the battery management system 100 enters the diagnostic mode. In other words, when the ignition signal is in a turn off state or the HEV/EV not ready state, the diagnostic apparatus 20 may be configured to output no diagnostic mode entry message (S103).

Meanwhile, when the ignition signal is in the turn on state or the HEV/EV not ready state, the diagnostic apparatus 20 may be configured to enter the diagnostic mode and thus the battery management system 100 may also be configured to enter the diagnostic mode (S104). First, it may be determined based on the following steps S104 to S111 whether the battery pack stage 210 is insulated-breakdown.

The battery management system 100 may be configured to measure the insulating resistance when the high voltage relay 200 is turned off (S105). In other words, when the high voltage relay 200 is turned off, the battery pack 100 may be separated from the high voltage relay 200 and therefore whether only the battery pack 100 is insulated-breakdown may be determined. Particularly, all of the high voltage components connected to the controller 400, that is, the motor 500, the hybrid starter generator 600, the compressor 700, and the electric oil pump 800 need to be turned off.

Therefore, the battery management system 100 may be configured to determine whether a pulse width modulation (PWM) of other controllers 400 is in a turn off state (S106). When the PWM of other controllers 400 is turned on, the insulation-breakdown of only the battery pack 200 may not be accurately measured and therefore the battery management system 100 may be configured to terminate the diagnostic mode (S107) and the diagnostic apparatus 20 may be configured to output a controller error message (S108).

Further, when the PWM of other controllers 400 is turned off, the insulating resistance value measured in step S105 may be determined to be equal to or greater than a reference value to determine whether the battery pack 200 is insulated-breakdown (S109). When the measured insulating resistance value is equal to or greater than the reference value, the controller may be configured to determine that the high voltage battery pack 200 is in the insulation-breakdown state and report on the determination and output the determination through the diagnostic apparatus 20 (S110), that is, notify a user regarding the determination by outputting a message on a display screen.

Moreover, when the insulating resistance value measured in step S109 is less than the reference value, the high voltage battery pack 200 may be determined to not be insulated-breakdown and whether the insulation-breakdown detection time exceeds a threshold value may be determined (S111). In response to determining that the insulation-breakdown detection time does not exceed the threshold value (e.g., is less than the threshold value), the method for diagnosing insulation-breakdown proceeds to the step S105 for re-detection and in response to determining that the insulation-breakdown detection time exceeds the threshold value, steps S112 to S118 determining whether the high voltage input stage 310 is insulated-breakdown are performed. In other words, the controller may be configured to confirm that the insulation-breakdown of the battery pack stage 210 does not occur and then determine whether the high voltage input stage 310 is insulated-breakdown. Like the case of diagnosing the insulation-breakdown of the battery pack stage 210, all of the high voltage components connected to the controller 400, that is, the motor 500, the hybrid starter generator 600, the compressor 700, and the electric oil pump 800 need to be turned off.

The battery management system 100 may be configured to measure the insulating resistance after the high voltage relay 300 is turned on (S112). Next, the battery management system 100 may be configured to determine whether the PWM of other controllers 400 is in a turn off state (S113). Particularly, when the PWM of other controllers 400 is turned on, the insulation-breakdown of only the high voltage input stage 310 may not be accurately measured and therefore the battery management system 100 may be configured to terminate the diagnostic mode (S114) and the diagnostic apparatus 20 may be configured to output the controller error message (S115).

Meanwhile, when the PWM of other controllers 400 is turned off, the controller may be configured to determine that the insulating resistance value measured in step S112 is equal to or greater than the reference value to determine whether the high voltage input stage 310 is insulated-breakdown (S116). When the measured insulating resistance value is equal to or greater than the reference value, the controller may be configured to determine that the high voltage input stage 310 is in the insulation-breakdown state and report and output the determination the diagnostic apparatus 20 (S117).

Furthermore, when the insulating resistance value measured in step S116 is less than the reference value, the controller may be configured to determine that the high voltage input stage 310 is not insulated-breakdown and whether the insulation-breakdown detection time exceeds the threshold value may be determined (S118). Particularly, in response to determining that the insulation-breakdown detection time does not exceed the threshold value (e.g., is less than the threshold value), the method for diagnosing insulation-breakdown proceeds to the step S113 for re-detection and in response to determining that the insulation-breakdown detection time exceeds the threshold value, the method for diagnosing insulation-breakdown enters steps (FIG. 3) determining whether the high voltage components 500 to 800 connected to other controllers 400 are insulated-breakdown.

Hereinafter, the method for diagnosing insulation-breakdown of each of the motor 500, the hybrid starter generator 600, the compressor 700, and the electric oil pump 800 among the vehicle components according to the exemplary embodiment of the present disclosure will be described in detail with reference to FIG. 3.

The battery management system 100 may be configured to sequentially perform the insulation-breakdown diagnosis on the motor 500, the hybrid starter generator 600, the compressor 700, and the electric oil pump 800 and perform the insulation-breakdown diagnosis by interlocking (e.g., communicating) with each controller 410 to 440. In particular, the insulating resistance may be measured by turning on only the component which performs the insulation-breakdown diagnosis when all of the motor 500, the hybrid starter generator 600, the compressor 700, and the electric oil pump 800 are turned off.

First, the battery management system 100 may be configured to request PWM on of the motor controller 410 (S201). Next, the battery management system 100 may be configured to determine whether the motor 500 is PWMed on by the motor controller 410 (S202) and in response to determining that the motor 500 is not yet PWMed on, determine whether a current standby time exceeds a predetermined threshold value (S203). In response to determining that the standby time does not exceed the threshold value, the battery management system 100 may be configured to re-request the PWM on of the motor using the motor controller 410 (S201).

Meanwhile, in response to determining that the standby time exceeds the threshold value, the motor 500 may not be properly PWMed on and therefore the battery management system 100 may be configured to terminate the diagnostic mode (S204) and the diagnostic apparatus 20 may be configured to output the controller error message (S205). In addition, when the PWM of the motor 500 is turned on, the battery management system 100 may be configured to determine whether the PWM of other components (e.g., hybrid starter generator 600, compressor 700, and electric oil pump 800) is turned on (S206) and in response to determining that the PWMed on components among other components are present, the battery management system 100 may be configured to terminate the diagnosis (S204) and then output the controller error message from the diagnostic apparatus 20 (S205).

Further, when the PWMed on components among other components are not present, the battery management system 100 may be configured to measure the insulating resistance for the motor 500 and determine whether the insulating resistance value is equal to or greater than the reference value to determine whether the motor 500 is insulated-breakdown (S207). As the determination result of step S207, when the motor 500 is insulated-breakdown, the battery management system 100 may be configured to generate and store a list of the insulation-breakdown components (S209). In particular, when the motor 500 is insulated-breakdown, similar to the battery pack stage 210 and the high voltage input stage 310, the reason for generating and storing the list of the insulation-breakdown components without performing the insulation-breakdown reporting after the insulation-breakdown is diagnosed is that the respective components may be simultaneously insulated-breakdown.

Meanwhile, as the determination result of step S207, in response to determining that the motor 500 is not insulated-breakdown, the controller may be configured to determine whether the detection time exceeds the threshold value (S208). When the detection time does not exceed the threshold value, the steps (S201 to S209) are repeatedly performed and when the detection time exceeds the threshold value, whether the diagnosis for all of the high voltage components is completed may be determined (S210).

When the diagnosis for all the controllers is not completed, other components may be selected (S211) to repeatedly perform the steps S201 to S211. For example, when the hybrid starter generator 600 is selected in step S211, the battery management system 100 may be configured to request the PWM on of the HSG controller in step S201 and whether the hybrid starter generator 600 is PWMed on in step S202 may be determined and then the following steps are performed identically. Next, steps S201 to S211 may be sequentially performed on the compressor 700 and the electric oil pump 800 to determine whether the compressor 700 and the electric oil pump 800 are insulated-breakdown.

After all determinations regarding whether each component is insulated-breakdown are completed, the battery management system 100 may be configured to transmit the information regarding the list of the insulation-breakdown components to the diagnostic apparatus 20 (S212) and the diagnostic apparatus 20 may be configured to output the list of the insulation-breakdown components to the monitor to enable the user to confirm the insulation-breakdown components (S213).

The exemplary embodiment of the present disclosure describes an example in which the insulation-breakdown diagnosis is sequentially performed on the high voltage components, that is, the motor 500, the hybrid starter generator 600, the compressor 700, and the electric oil pump 800, but the insulation-breakdown diagnosis may be performed on the high voltage components independent of an order.

As described above, the present disclosure may more accurately sort (e.g., detect) the insulation-breakdown portion of the high voltage components within the vehicle system of the hybrid electric vehicle or the electric vehicle. As set forth above, according to the exemplary embodiments of the present disclosure, it may be possible to improve the service efficiency and prevent incorrect service by more accurately detecting the defective components due to the insulation-breakdown among the vehicle components.

The exemplary embodiments of the present disclosure described above have been provided for illustrative purposes. Therefore, those skilled in the art will appreciate that various modifications, alterations, substitutions, and additions are possible without departing from the scope and spirit of the disclosure as disclosed in the accompanying claims and such modifications, alterations, substitutions, and additions fall within the scope of the present disclosure.

What is claimed is:

1. A system for diagnosing insulation-breakdown of a vehicle component including a system within a vehicle having high voltage components, comprising:
a battery pack configured to supply a high voltage to the vehicle;
a high voltage relay connected to an output stage of the battery pack;
a high voltage component controller connected to an output stage of the high voltage relay and configured to turn each high voltage component on and off; and
a battery management system configured to interlock with the battery pack, the high voltage relay, and the high voltage component controller to diagnose whether the battery pack, an input stage of the high voltage component controller, and the high voltage component are insulated-breakdown,
wherein the battery management system measures an insulation resistance after turning on the high voltage relay when the battery pack is not in an insulation breakdown state and checks whether the high voltage components are off, and
wherein the battery management system determines whether the high voltage components are off and determines the insulation breakdown of the input stage of the high voltage component between the high voltage relay and the high voltage component controller using the measured insulation resistance when the high voltage component is off.

2. The system according to claim 1, further comprising:
a diagnostic apparatus provided extraneous to the vehicle and configured to interlock with the battery management system which is the system within the vehicle to output an insulation-breakdown diagnostic result onto a display screen.

3. The system according to claim 1, wherein the high voltage component is at least one selected from the group consisting of: a motor, a hybrid starter generator (HSG), a compressor, and an electric oil pump (EOP).

4. A method for diagnosing insulation-breakdown of a vehicle component of a vehicle system including a battery pack, a high voltage relay, a high voltage component controller, and a high voltage component, comprising:
determining, by a controller, whether the battery pack is insulated-breakdown when the high voltage relay and the high voltage component are in an off state;
measuring, by the controller, an insulation resistance when the high voltage relay is in an on state when the battery pack is not in an insulation-breakdown state;
determining, by the controller, whether the high voltage components are in an off state;
determining, by the controller, the insulation breakdown of an input stage of the high voltage component using the measured insulation resistance when the high voltage component is off; and
in response to determining that the input stage of the high voltage component is not in an insulation-breakdown state, determining, by the controller, whether the high voltage component is insulated-breakdown.

5. The method according to claim 4, wherein the determination of whether the battery pack is insulated-breakdown includes:
measuring, by the controller, insulating resistance when the high voltage relay is in the off state;
determining, by the controller, whether the high voltage component is in the off state;
determining, by the controller, whether the battery pack is insulated-breakdown using the measured insulating resistance when the high voltage component is in the off state; and
performing, by the controller, reporting on the insulation-breakdown of the battery pack when the battery pack is insulated-breakdown.

6. The method according to claim 5, further comprising:
when the high voltage component is in the on state, terminating, by the controller, an insulation-breakdown diagnosis and outputting an error message.

7. The method according to claim 4, wherein the determination of whether the high voltage input stage is insulated-breakdown includes:
performing, by the controller, the reporting on the insulation-breakdown of the high voltage input stage when the high voltage input stage is insulated-breakdown.

8. The method according to claim 7, further comprising:
in response to determining that the high voltage component is the on state, terminating, by the controller, an insulation-breakdown diagnosis and outputting an error message.

9. The method according to claim 4, wherein in the determination of whether the high voltage component is insulated-breakdown, the high voltage component is at least one selected from the group consisting of: a motor, a hybrid starter generator (HSG), a compressor, and an electric oil pump (EOP), and the motor, the hybrid starter generator (HSG), the compressor, and the electric oil pump (EOP) are sequentially turned on to determine whether each is insulated-breakdown.

10. The method according to claim 9, wherein the determination of whether the high voltage component is insulated-breakdown includes:
requesting, by the controller, a turn on of the motor to a motor controller;
terminating, by the controller, a diagnosis when the motor is not turned on within a predetermined time and outputting an error message;
determining, by the controller, whether at least one of the hybrid starter generator, the compressor, and the electric oil pump is in an on state when the motor is turned on within the predetermined time; and
determining, by the controller, whether the motor is insulated-breakdown when all of the hybrid starter generator, the compressor, and the electric oil pump are in an off state and generating and storing a list of the insulation-breakdown components.

11. The method according to claim 10, wherein the determination of whether the high voltage component is insulated-breakdown includes:
after performing the diagnosis regarding whether the motor is insulated-breakdown, determining, by the controller, whether at least one of the hybrid starter generator, the compressor, and the electric oil pump is insulated-breakdown.

12. The method according to claim 11, further including:
when the insulation-breakdown diagnosis for the motor, the hybrid starter generator, the compressor, and the electric oil pump is completed, outputting, by the controller, the list of the insulation-breakdown components.

13. A non-transitory computer readable medium containing program instructions executed by a controller, the computer readable medium comprising:

program instructions that determine whether a battery pack within a vehicle system is insulated-breakdown when a high voltage relay and a high voltage component of the vehicle system are in an off state;

program instructions that measure an insulation resistance when the high voltage relay is in an on state when the battery pack is not in an insulation-breakdown state;

program instructions that determine whether the high voltage components are in an off state; and program instructions that determine the insulation breakdown of an input stage of the high voltage component using the measured insulation resistance when the high voltage component is off, in response to determining that the input stage of the high voltage component is not in an insulation-breakdown state.

14. The non-transitory computer readable medium of claim 13, wherein the program instructions for the determination of whether the battery pack is insulated-breakdown include:

program instructions that measure insulating resistance when the high voltage relay is in the off state;

program instructions that determine whether the high voltage component is in the off state;

program instructions that determine whether the battery pack is insulated-breakdown using the measured insulating resistance when the high voltage component is in the off state; and program instructions that perform reporting on the insulation-breakdown of the battery pack when the battery pack is insulated-breakdown.

15. The non-transitory computer readable medium of claim 13, wherein in the determination of whether the high voltage component is insulated-breakdown, the high voltage component is at least one selected from the group consisting of: a motor, a hybrid starter generator (HSG), a compressor, and an electric oil pump (EOP), and the motor, the hybrid starter generator (HSG), the compressor, and the electric oil pump (EOP) are sequentially turned on to determine whether each is insulated-breakdown.

\* \* \* \* \*